US007222258B2

(12) United States Patent
Rothman et al.

(10) Patent No.: US 7,222,258 B2
(45) Date of Patent: May 22, 2007

(54) COMPRESSING A FIRMWARE IMAGE

(75) Inventors: Michael A. Rothman, Gig Harbor, WA (US); Vincent J. Zimmer, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 410 days.

(21) Appl. No.: 10/325,208

(22) Filed: Dec. 18, 2002

(65) Prior Publication Data

US 2004/0114808 A1     Jun. 17, 2004

(51) Int. Cl.
    *G06F 11/00*     (2006.01)
(52) U.S. Cl. .......................................... 714/6; 717/168
(58) Field of Classification Search ................ 717/168, 717/170, 153; 714/6, 36; 713/1, 2
    See application file for complete search history.

(56) References Cited

U.S. PATENT DOCUMENTS

| 5,922,072 | A  | * | 7/1999  | Hutchinson et al. ........... 713/2   |
| 6,324,692 | B1 | * | 11/2001 | Fiske .......................... 717/171 |
| 6,425,125 | B1 | * | 7/2002  | Fries et al. .................. 717/168 |
| 6,457,175 | B1 | * | 9/2002  | Lerche ........................ 717/173 |
| 6,591,376 | B1 | * | 7/2003  | VanRooven et al. .......... 714/36 |
| 6,637,023 | B1 | * | 10/2003 | Ginsberg .................... 717/122 |
| 6,640,334 | B1 | * | 10/2003 | Rasmussen ................. 717/171 |
| 6,668,374 | B1 | * | 12/2003 | Sten et al. .................. 717/173 |
| 6,681,390 | B2 | * | 1/2004  | Fiske .......................... 717/173 |
| 6,684,396 | B1 | * | 1/2004  | Brittain et al. .............. 717/168 |
| 6,728,956 | B2 | * | 4/2004  | Ono ............................ 717/168 |
| 6,834,384 | B2 | * | 12/2004 | Fiorella et al. ............. 717/169 |
| 6,836,657 | B2 | * | 12/2004 | Ji et al. ....................... 455/419 |
| 6,907,598 | B2 | * | 6/2005  | Fraser ........................ 717/127 |
| 6,907,602 | B2 | * | 6/2005  | Tsai et al. ................... 717/168 |
| 2002/0034105 | A1 | * | 3/2002 | Kulkami et al. ............. 365/200 |
| 2002/0042892 | A1 | * | 4/2002 | Gold ............................. 714/6 |
| 2002/0092010 | A1 | * | 7/2002 | Fiske .......................... 717/168 |
| 2002/0178332 | A1 | * | 11/2002 | Wilson et al. .............. 711/154 |
| 2003/0229709 | A1 | * | 12/2003 | Fraser ........................ 709/231 |
| 2004/0006689 | A1 | * | 1/2004  | Miller et al. ................... 713/1 |

OTHER PUBLICATIONS

Lefurgy, Charles; Bird, Peter; Chen, I-Cheng; Mudge, Trevor, Improving Code Density Using Compression Techniques, IEEE, 1997.*
Liao, Stan Yi-Huang, Code Generation and Optimization for Embedded Digital Signal Processors, MIT, Jun. 1996.☐☐*
Microsoft Computer Dictionary, Microsoft Press, 1999, p. 49.*
Fraser, Christopher W.; Myers, Eugene W.; Wendt, Alan L., Analyzing and Compressing Assembly Code, ACM SigPlan, 1984.☐☐*

* cited by examiner

*Primary Examiner*—Robert Beausoliel
*Assistant Examiner*—Christopher McCarthy
(74) *Attorney, Agent, or Firm*—Trop, Pruner & Hu, P.C.

(57) ABSTRACT

A technique in accordance with the invention includes scanning data to locate multiple occurrences of a data pattern. One of the multiple occurrences is designated to be part of a firmware image. The technique includes, for each occurrence other than the designated occurrence, substituting a pointer to the designated occurrence.

15 Claims, 6 Drawing Sheets

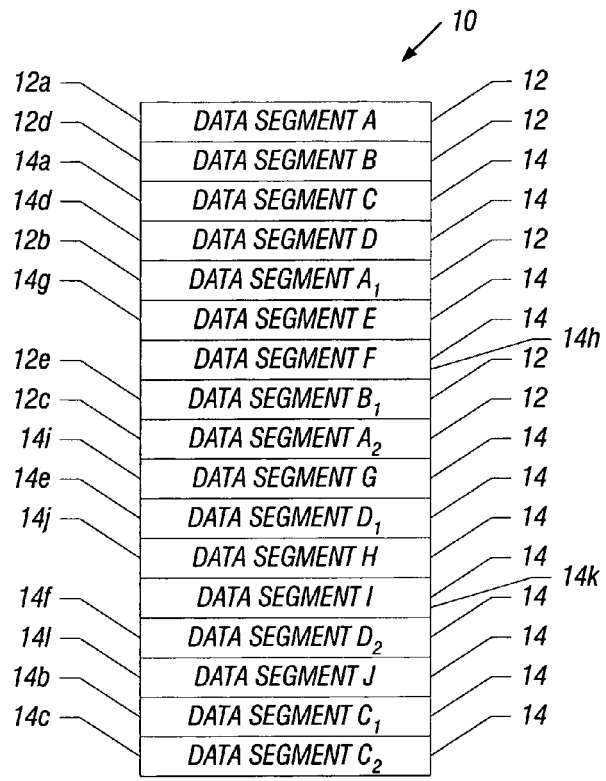
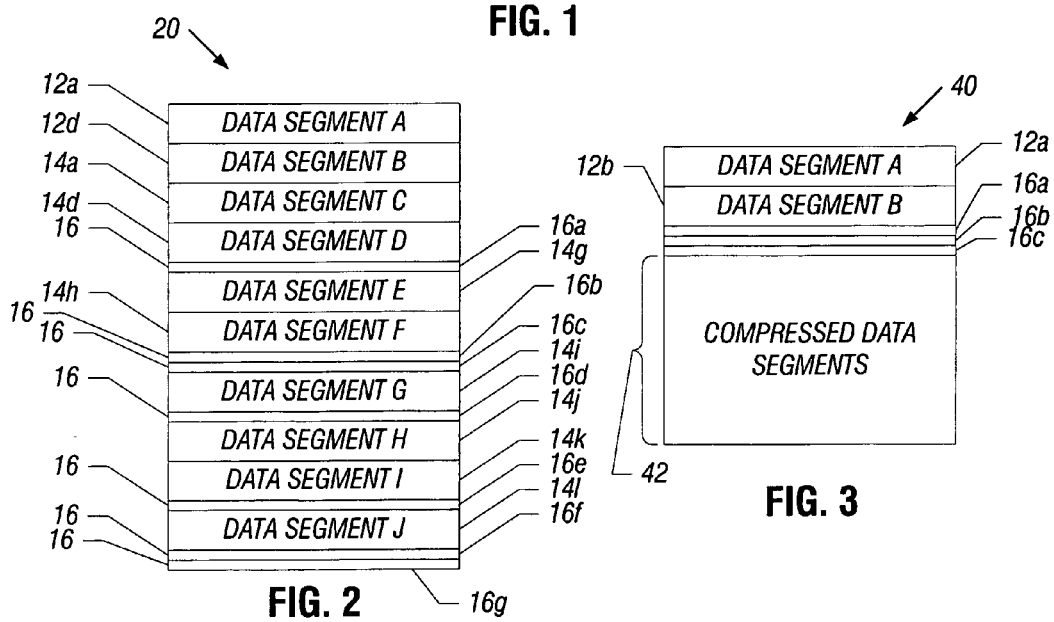

COMPRESSING A FIRMWARE IMAGE

BACKGROUND

The invention generally relates to compressing a firmware image.

When a computer system powers up, or "boots up," a processor of the computer system typically executes a program that is stored in a non-volatile memory, or firmware memory, for purposes of performing various boot-up functions. As example, these functions may include detecting devices that are installed in the computer system, performing a power on self-test, loading the operating system, etc.

During an initial phase of the boot up, the main system memory is not yet initialized and thus, is unavailable. Therefore, during this phase, the processor executes instructions directly from the firmware memory. These instructions are part of execute-in-place (XIP) files that are stored in the firmware memory and are designated by a file type or moniker. The XIP files, as their names imply, are designed to be executed in place from the firmware memory without requiring the files to be copied, or "shadowed," to another memory. Simple, linear addressing mechanisms are used to locate the XIP files.

The XIP files are part of a collection of files that form a firmware image. It is typically desirable to compress the size of the firmware image because the firmware memory has a limited capacity. Non-XIP files and the modules that are associated with these non-XIP files can be compressed because these files are typically associated with the phase of bootup in which system memory is available.

A typical type of compression is Lempel-Ziv-Welch (LZW) compression. In this approach, the compression algorithm creates a dictionary for a particular bit pattern and any pattern that has been read before. This results in a substitution of the commonality, resulting in shorter code sequences and effectively compressing the total amount of input data. Another typical type of compression is Huffman encoding. A Huffman encoding algorithm essentially maintains a count of the highest frequency occurring elements in a particular input data stream. The elements with the highest frequency get assigned shorter encodings, and the elements with the lower frequencies get assigned longer encodings. This accomplishes essentially the same goal of lossless compression of the input data.

Compression/decompression of non-XIP files may be used because the compressed non-XIP files may be copied into system memory where the non-XIP files may be decompressed. However, challenges arise in compressing XIP files because these files must be read directly from the firmware memory.

Thus, there is a continuing need for better ways to reduce the sizes of XIP files that are stored in a firmware memory.

BRIEF DESCRIPTION OF THE DRAWING

FIG. 1 is a schematic diagram of a volume of files used to form a firmware image.

FIG. 2 is a schematic diagram of an image formed from the volume of FIG. 1 after the compression of execute-in-place and non-execute-in-place files according to an embodiment of the invention.

FIG. 3 is a schematic diagram of an image formed from the image of FIG. 2 after non-execute-in-place files have been compressed according to an embodiment of the invention.

DETAILED DESCRIPTION

Figure 4:
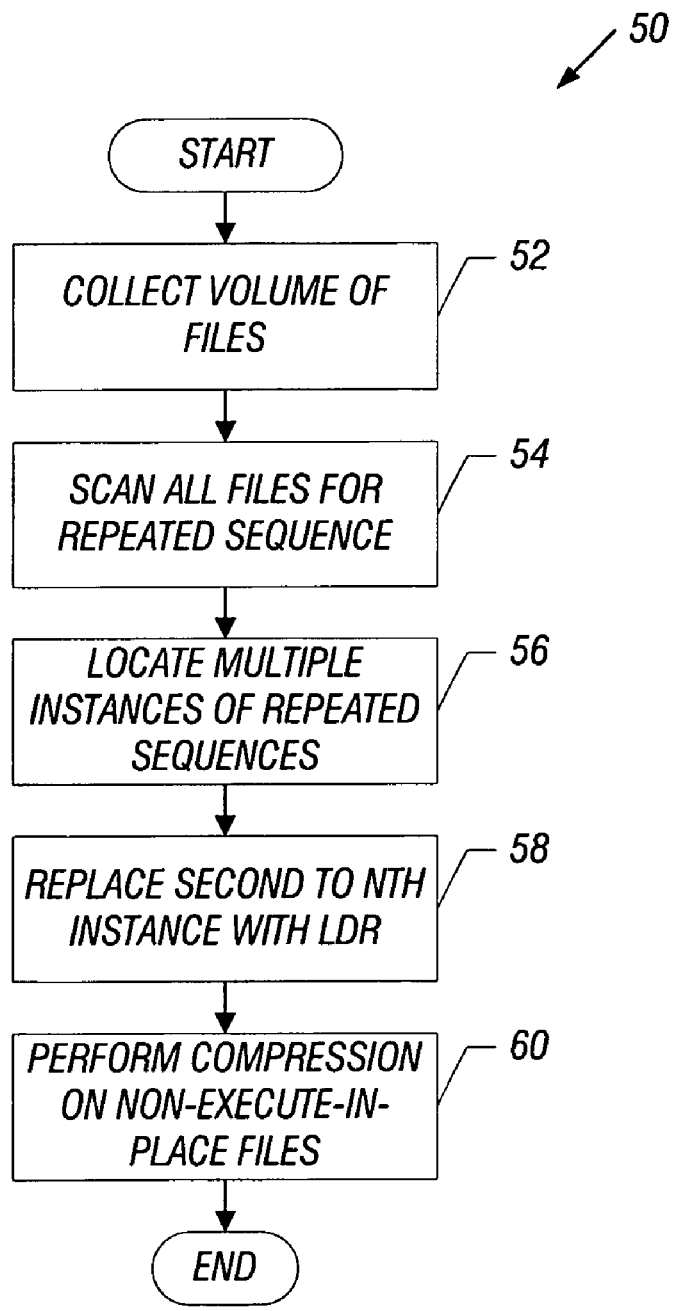
FIG. 4 is a flow diagram depicting a technique to compress files to form a firmware image according to an embodiment of the invention.

Referring to FIG. 4, an embodiment 50 of a technique in accordance with the invention may be used to compress a volume of files to form a firmware image that, as its name implies, may be stored in a firmware memory of a computer system. As an example, in some embodiments of the invention, this firmware image may form a basic input output system (BIOS) image that is stored in a memory (a flash memory, for example) of a computer system. As described herein, the technique 50 may be used to not only compress non-execute-in-place (XIP) files, but, the technique 50 may also be used to compress XIP files in accordance with the invention.

More specifically, in some embodiments of the invention, the technique 50 includes collecting a volume of files to be compressed, as depicted in block 52 of FIG. 4. As a more specific example, FIG. 1 depicts an exemplary volume 10 of files to be compressed. The volume 10 is depicted in FIG. 1 as being formed from various data segments, and each file of the volume 10 includes one or more of these data segments. The data segments include segments 12 that are associated with XIP files and segments 14 that are associated with non-XIP files.

For the exemplary volume 10 that is depicted in FIG. 1, data segments 12*a*, 12*b*, 12*c*, 12*d* and 12*e* (where the prefix "12" indicates an XIP data segment) may be associated with a particular XIP file. Alternatively, the data segments 12*a*, 12*b*, 12*c*, 12*d* and 12*e* may be associated with multiple XIP files. Thus, for example, some of the data segments 12*a*, 12*b*, 12*c*, 12*d* and 12*e* may be associated with one XIP file, other data segments 12*a*, 12*b*, 12*c*, 12*d* and 12*e* may be associated with another XIP file, etc.

In FIG. 1, the data segments that are identical are represented by similar letters that follow the word "Data Segment." For example, the data segment 12*a* (having an "A" identifier") is identical to data segments 12*b* (having an "A$_1$" identifier) and 12*c* (having an "A$_2$" identifier). Thus, the data segment 12*a* forms an instance of a repeating sequence of data, and the data segments 12*b* and 12*c* represent additional instances of this repeating sequence. As another example, the data segment 12*d* (having a "B" identifier) is identical to data segment 12*e*. Thus, the data segment 12*d* forms an instance of a repeating sequence of data, and the data segment 12*e* represents another instance of this repeating sequence.

In some embodiments of the invention, the volume 10 may include data segments 14 that are associated with one or more non-XIP files. Similar to the data segments 12, these data segments 14 may also have repeating sequences. For example, in the volume 10 that is depicted in FIG. 1, data segments 14*a*, 14*b* and 14*c* (being associated with a "C"

identifier) are identical; and data segments 14*d*, 14*e* and 14*f* (being associated with a "D" identifier) are identical.

It is noted that some of the data segments of the volume 10 may not be identical. For example, as illustrated in the exemplary volume 10, the data segments 14*g*, 14*h*, 14*i*, 14*j*, 14*k* and 14*l* (associated with the "E," "F," "G," "H," "I," and "J" identifiers, respectively) are each unique, and the volume 10 does not include repeated instances of any of these segments.

Other variations are possible. For example, although not depicted in FIG. 1, the data segments 12 may also form non-repeating sequences. As an example of another variation, in some embodiments of the invention, the data segments 12 may not contain any multiple instances of a data sequence and/or the data segments 14 may not contain any multiple instances of a data sequence.

Still referring to FIG. 4, subsequent to the collection of the volume 10 of files (block 52), the technique 50 includes scanning the files for repeated sequences, as depicted in block 54. In this regard, the scanning identifies segments (called "sequences") that are identical. Thus, the scanning locates (block 56 in FIG. 4) multiple instances of repeated sequences of data.

For purposes of compressing the sizes of XIP and non-XIP files, the technique 50 includes replacing the second to the nth instance of a sequence with an entity called a link descriptor record (LDR), as depicted in block 58. In some embodiments of the invention, the LDR, in general, is a unique identifier that points to a single instance of a repeated sequence. In some embodiments of the invention, each instance (or "segment") of the second through the nth instances of a repeated sequence is replaced with an LDR. These replacements are graphically depicted in an image 20 (FIG. 2) that is formed by replacing repeated instances of data from the volume 20 with LDRs 16.

As an example, pursuant to the technique 50, the second instance (i.e., the data segment 12*b*) of the data segment 12*a* of the volume 10 is replaced with an associated LDR 16*a*. This LDR 16*a* references, or "points to," the first instance, or the data segment 12*a*. Thus, comparing the volume 10 to the image 20, the data segment 12*b* has been replaced with the LDR 16*a*. In a similar manner, the data segments 12*e*, 12*c*, 14*e*, 14*f*, 14*b* and 14*c* of the volume 10 are replaced with corresponding LDRs 16*b*, 16*c*, 16*d*, 16*e*, 16*f* and 16*g*, respectively, in the image 20. Thus, as can be appreciated from the example described above, multiple instances of segments 12 associated with one or more XIP files and multiple instances of segments 14 associated with one or more non-XIP files are replaced with LDRs 16 to effectively compress both XIP and non-XIP files.

In some embodiments of the invention, a multiple instance of a data segment 12, 14 may not be always replaced with an LDR 16. For example, in some embodiments of the invention, the replacement (block 58) of a particular instance with an LDR 16 is performed if the size of the LDR 16 is less than the size of the data segment 12, 14 that the LDR 16 replaces, and the replacement may not occur otherwise. In general, in some embodiments of the invention, the replacement of a particular instance with an LDR 16 is performed if the overhead associated with replacing the instance with the LDR 16 is less than the overhead associated with the instance remaining in the final firmware image.

Referring to FIG. 4, subsequent to block 58, the technique 50 includes performing (block 60) compression on the non-XIP files to form the final image, such as an exemplary image 40 that is depicted in FIG. 3. As examples, in some embodiments of the invention, this compression may be a lossless type of compression, such as Lempel-Ziv-Welch (LZW) compression, Huffman encoding, etc. Other types of compression may be used.

As shown by way of example in FIG. 3, this compression results in a compressed data segment portion 42 of the image 40; LDRs 16*a*, 16*b* and 16*c*, which are associated with the XIP files; and data segments 12*a* and 12*d* that are associated with the XIP files.

Figure 5:
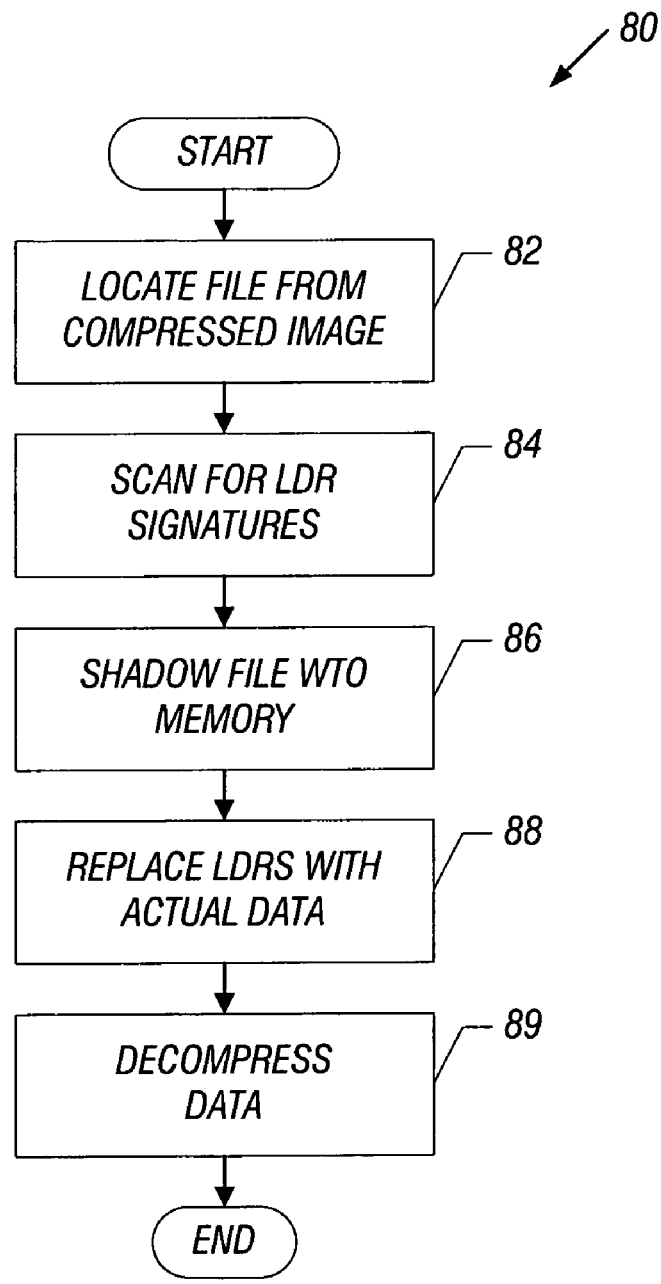
FIG. 5 is a flow diagram depicting a technique to read a non-execute-in-place file from a compressed firmware image according to an embodiment of the invention.

Referring to FIG. 5, a technique 80 may be used for purposes of reading a non-XIP file from a compressed firmware image (such as the image 40 (FIG. 3), for example) formed using the technique described above. The technique 80 may include decompressing (block 81) the firmware image. This operation may be performed by, for example, transferring the image from the firmware memory into the system memory of the computer system.

Next, the technique 80 may include locating a particular file from the compressed image, as depicted in block 82. Subsequently, the image is scanned for any LDR signatures, as depicted in block 84. In this manner, the detection of a particular LDR 16 indicates that duplication of a particular instance is required. The file is then copied, or "shadowed," into system memory, as depicted in block 86. Lastly in the technique 80, the LDRs 16 are replaced with the actual data, as depicted in block 88. In this manner, each LDR 16 is replaced with a copy of a particular data segment of the file. Thus, redundant data segments of the file are recreated in the system memory.

Figure 6:
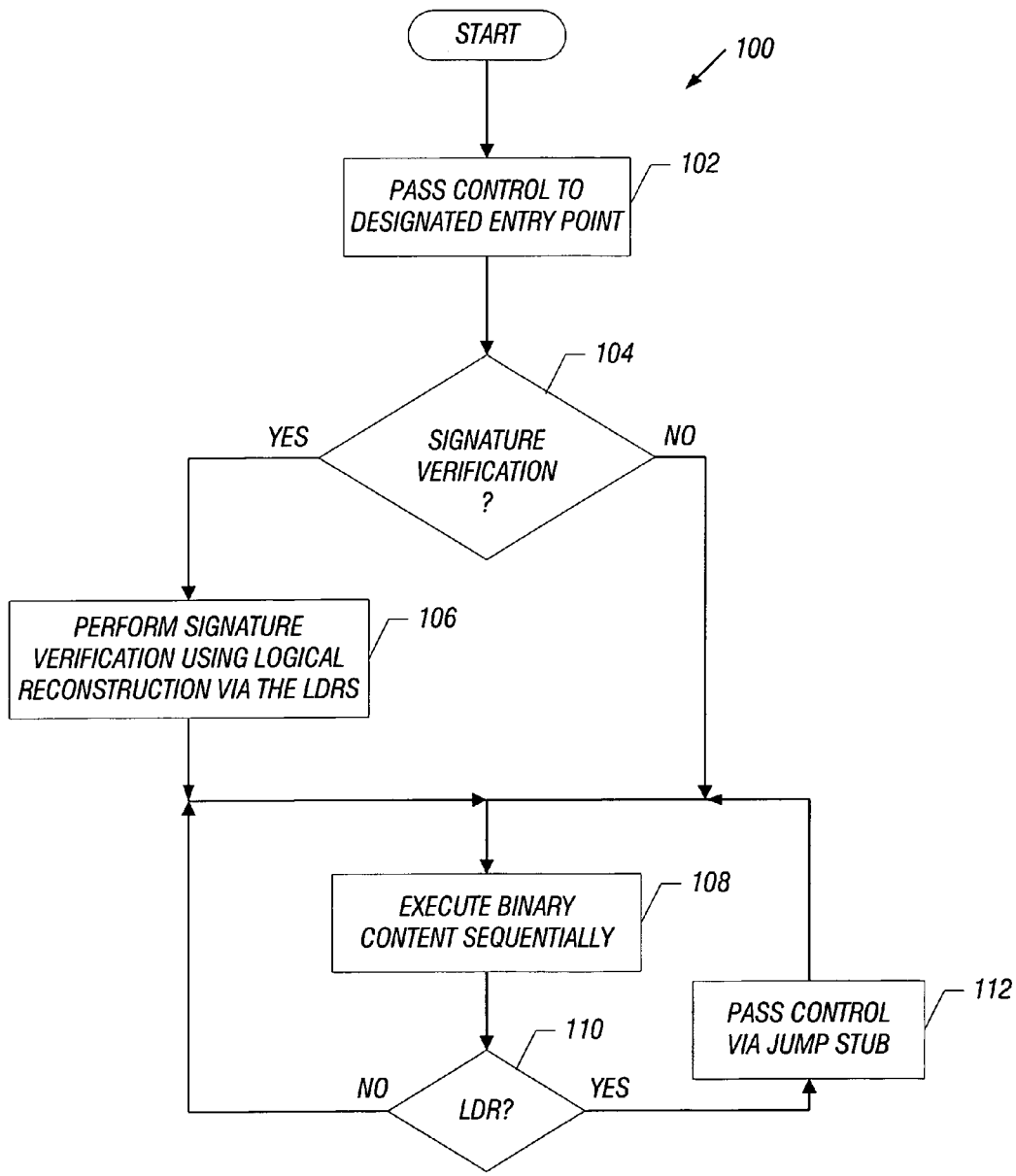
FIG. 6 is a flow diagram depicting a technique to read an execute-in-place file from a compressed firmware image according to an embodiment of the invention.

Referring to FIG. 6, in some embodiments of the invention, a technique 100 may be used for purposes of reading an XIP file from the compressed file image directly from firmware memory. In this regard, in some embodiments of the invention, the technique 100 includes passing control to a designated entry point for a given XIP file, as depicted in block 102. Next, the technique 100 includes determining (diamond 104) whether there is digital signature operation to be formed across the image. If so, then the digital signature operation is performed (block 106) using logical reconstruction via the LDRs. Such a technique is permitted because the originator of the image signed the non-LDR annotated image. As LDR-annotation is reversible and understood, a firmware security model is not compromised by the above-described compression of the XIP file.

Next in the technique 100, the binary content of the file is executed sequentially, as depicted in block 108. If during the execution of this binary content, an LDR 16 is detected (as depicted in diamond 110), then control is passed to the associated data segment via a pointer called a "jump stub," as depicted in block 112.

Figure 7:
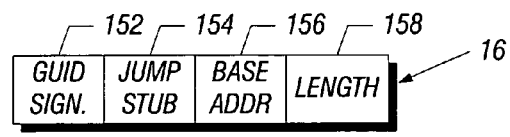
FIG. 7 is an illustration of a link descriptor record according to an embodiment of the invention.

In some embodiments of the invention, a particular LDR 16 may have a structure that is depicted in FIG. 7. In this manner, the LDR 16 may include a globally unique identifier (GUID) signature field 152 that uniquely identifies the particular LDR 16. The LDR 16 may also include a base address field 156 that identifies the base address of the referenced data segment. The LDR 16 may also include a length field 158 that, as its name implies, indicates a length of the associated data segment. For an LDR that is associated with an XIP file, the LDR 16 includes a jump stub field 154, a field that includes a pointer (such as a push instruction of the address to return to and a jump instruction, for example) to the associated data segment. The pointer may emulate a CALL-type instruction such that what is "pushed" onto the stack is the address to the code that immediately follows the LDR signature.

Figure 8:
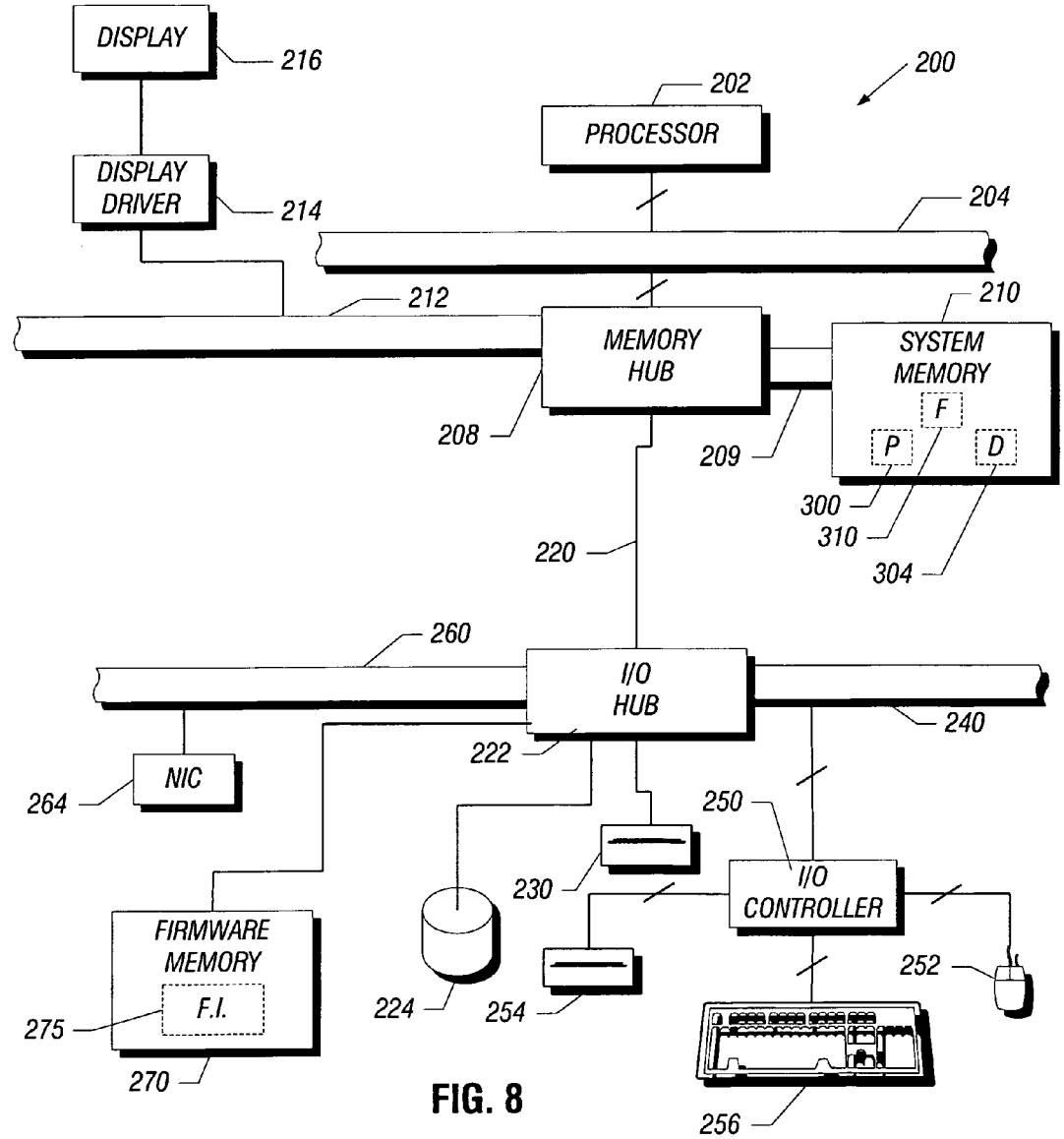
FIGS. 8 and 9 are schematic diagrams of computer systems according to embodiments of the invention.

Referring to FIG. 8, in some embodiments of the invention, the techniques 80 and 100 may be performed on a computer system 200. For example, the computer system 200 may store a compressed firmware image 275 in a firmware memory 270 of the computer system 200. In this regard, the processor 202 may, during the startup, or "boot up," of the system 200, read XIP and non-XIP files from the firmware image 275, pursuant to the techniques 80 and 100 discussed above. To accomplish these functions, the processor 202 may execute instructions contained in XIP files of the firmware image 275 during the startup phase before memory initialization pursuant to the technique 100, and after memory initialization, the processor 202 may decompress the non-XIP files (pursuant to the technique 80) by transferring these files to memory, as indicated by the reference numeral "310." The processor 202 performs the techniques 80 and 100 by executing instructions that are originally stored in, for example, the firmware memory 270. Some or all of these instructions may be stored in another storage device in other embodiments of the invention.

In some embodiments of the invention, the processor 202 communicates over a system bus 204. As examples, the processor 202 may include one or more microprocessors, such as a Pentium microprocessor, for example. Other components may be coupled to the system bus 204 to communicate with the processor 202, such as, for example, a north bridge, or memory hub 208. The memory hub 208 establishes communication between the system bus 204 and a memory bus 209 and an Accelerated Graphics Port (AGP) bus 212. The AGP is described in detail in the Accelerated Graphics Port Interface Specification, Revision 1.0, published on Jul. 31, 1996, by Intel Corporation of Santa Clara, Calif. A system memory 210 may be coupled to the system bus 209, and a display driver 214 may be coupled to the AGP bus 212. The display driver 214, in turn, generates signals for a display 216 of the computer system 200.

The memory hub 208 may communicate with a south bridge, or input/output (I/O) hub 212. The I/O hub 222, in turn, may communicate with an I/O expansion bus 240 and a Peripheral Component Interconnect (PCI) bus 260. The PCI Specification is available from The PCI Special Interest Group, Portland, Oreg. 97214.

As examples, various devices may communicate with the I/O hub 222, such as the firmware memory 270, a hard disk drive 224 and a CD ROM drive 230. In some embodiments of the invention, the firmware memory 270 may be a flash memory or other type of firmware memory, depending on the particular embodiment of the invention.

A network interface card (NIC) 264 may be coupled to the PCI bus 260. An I/O controller 250 may be coupled to the I/O expansion bus 240. The I/O controller 250 may receive input from a mouse 252 and a keyboard 256, as well as control operations of a floppy disk drive 254.

Other embodiments and variations for the computer system 200 are possible.

Figure 9:
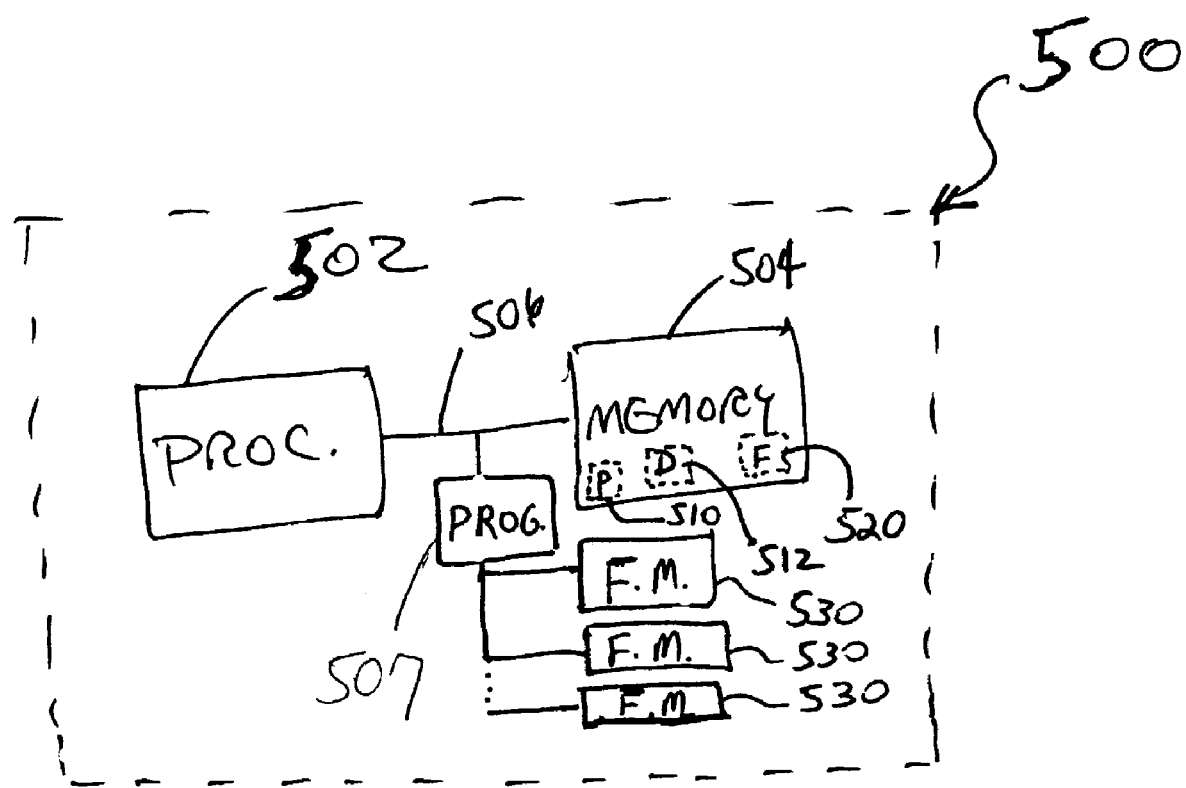

Referring to FIG. 9, in some embodiments of the invention, a computer system 500 may be used for purposes of compressing binary image files (pursuant to the technique 50) to form the compressed firmware image. As an example, the computer system 500 may be used at the manufacturing facility of the computer system 200. Thus, the original equipment manufacturer (OEM) may, for example, create the compressed firmware image to be stored in the firmware memory of the computer system 200. Alternatively, the compressed firmware image that is created by the computer system 500 may be used by the user of the computer system 200 to update the firmware image of the computer system 200.

As an example, the computer system 500 may include a processor 502 that executes instructions 510 (stored in a system memory 504 of the computer system 500) to cause the processor 502 to compress data 512 (that represents binary image files) to form a compressed firmware image 520 pursuant to the technique 50. The processor 502 and the system memory 504 may communicate over a system bus 506. In some embodiments of the invention, a firmware memory programmer 507 may be coupled to the system bus 506 for purposes of communicating the compressed firmware image 520 onto one or more firmware memory devices 530 (flash memory devices or another type of non-volatile memory devices, as examples). Alternatively, the firmware image may be stored in one of various removable media, such as a floppy disk, a CD-ROM, or transmitted by one of various other ways to an ultimate destination where the firmware image is stored in a firmware memory of a computer system by an end user. Other variations are possible.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   using a computer to scan data to locate at least three occurrences of a data pattern;
   designating one of the occurrences to be part of a firmware image;
   for each occurrence other than said one of the occurrences, substituting a pointer to said one of the occurrences for said each occurrence in the firmware image;
   determining whether said one of the occurrences is associated with a file executable before system memory setup; and
   based on the determination, compressing said one of the occurrences.

2. The method of claim 1, wherein determining comprises determining whether the file comprises an execute in place file.

3. The method of claim 1, further comprising:
   forming the firmware image from additional segments of the data.

4. An article comprising a computer readable storage medium storing instructions that when executed cause a processor-based system to:
   scan data to locate a first segment of the data that is substantially identical to a second segment of the data and locate a third segment of the data that is substantially identical to a fourth segment of the data,
   form a firmware image in which a first pointer to one of the first segment and the second segment is substituted for said one of the first segment and the second segment and a second pointer to one of the third segment and the fourth segment is substituted for said one of the third segment and the fourth segment,
   determine whether the other of said one of the first segment and the second segment is associated with a file executable before system memory initialization, and
   based on the determination, compress said other of said one of the first segment and the second segment.

5. The article of claim 1, wherein the storage medium stores instructions to cause the processor-based system to:
   determine whether the data is part of an execute in place file, and
   selectively perform compression based on the determination.

6. The article of claim 1, wherein the storage medium stores instructions to cause the processor-based system to:
   form the firmware image from additional segments of the data.

7. The article of claim 1, wherein the data is associated with binary image files.

8. A system comprising:
   a processor; and
   a memory coupled to the processor storing a program to cause the processor to:
      scan data to locate a first segment of the data that is substantially identical to a second segment of the data and locate a third segment of the data that is substantially identical to a fourth segment of the data, and
      form a firmware image in which a first pointer to one of the first segment and the second segment is substituted for said one of the first segment and the second segment and a second pointer to one of the third segment and the fourth segment is substituted for said one of the third segment and the fourth segment, wherein
   the processor determines whether another of said one of the first segment and the second segment is associated with a file executable before system memory initialization, and
   based on the determination, the processor compresses said other of said one of the first segment and the second segment.

9. The system of claim 8, wherein the processor determines whether the file comprises an execute in place file.

10. The system of claim 8, wherein the processor forms the firmware image from additional segments of the data.

11. The system of claim 8, wherein the data is associated with binary image files.

12. A system comprising:
   a flash memory;
   a processor; and
   a memory coupled to the processor storing a program to cause the processor to:
      scan data to locate a first segment of the data that is substantially identical to a second segment of the data and locate a third segment of the data that is substantially identical to a fourth segment of the data, and
      form a firmware image in which a first pointer to one of the first segment and the second segment is substituted for said one of the first segment and the second segment and a second pointer to one of the third segment and the fourth segment is substituted for said one of the third segment and the fourth segment, and
      store the firmware image in the flash memory wherein
   the processor determines whether another of said one of the first segment and the second segment is associated with a file executable before system memory initialization, and
   based on the determination, the processor compresses said other of said one of the first segment and the second segment.

13. The system of claim 12, wherein the processor determines whether the file comprises an execute in place file.

14. The system of claim 12, wherein the processor forms the firmware image from additional segments of the data.

15. The system of claim 12, wherein the data is associated with binary image files.

* * * * *